United States Patent
Dent

(10) Patent No.: US 7,380,200 B2
(45) Date of Patent: May 27, 2008

(54) SOFT ERROR DETECTION AND CORRECTION BY 2-DIMENSIONAL PARITY

(75) Inventor: Peter Dent, Irthlingborough (GB)

(73) Assignee: Texas Instruments Incorporated, Dallas, TX (US)

( * ) Notice: Subject to any disclaimer, the term of this patent is extended or adjusted under 35 U.S.C. 154(b) by 655 days.

(21) Appl. No.: 10/949,872

(22) Filed: Sep. 24, 2004

(65) Prior Publication Data
US 2005/0149839 A1 Jul. 7, 2005

(30) Foreign Application Priority Data
Sep. 26, 2003 (GB) ................... 0322597.6

(51) Int. Cl.
*G11C 29/00* (2006.01)
(52) U.S. Cl. .................................... 714/805
(58) Field of Classification Search ................. None
See application file for complete search history.

(56) References Cited

U.S. PATENT DOCUMENTS

| | | | | |
|---|---|---|---|---|
| 4,764,927 A | * | 8/1988 | Izumita et al. | 714/761 |
| 5,592,499 A | * | 1/1997 | Tanoi | 714/773 |
| 6,216,251 B1 | * | 4/2001 | McGinn | 714/800 |

* cited by examiner

*Primary Examiner*—Jacques Louis-Jacques
*Assistant Examiner*—Sam Rizk
(74) *Attorney, Agent, or Firm*—Robert D. Marshall, Jr.; W. James Brady; Frederick J. Telecky, Jr.

(57) ABSTRACT

The parity of this invention includes two arrays of parities surrounding the memory. One array is generated in parallel. The other array is generated in serial. The two dimensional parity is used to protect, locate and correct errors automatically. The second parity is provided for only a subset of the address range of the memory. The memory controller does not compare the second parities unless there is a soft error in the first parity. The second parities are calculated upon command and not upon each memory write as the first parity.

13 Claims, 2 Drawing Sheets

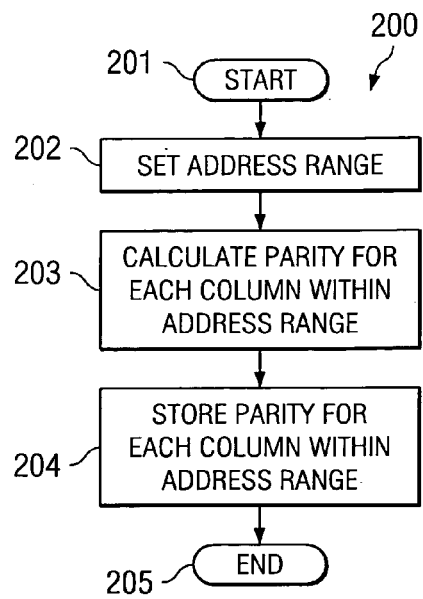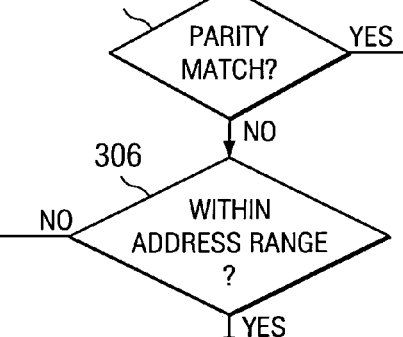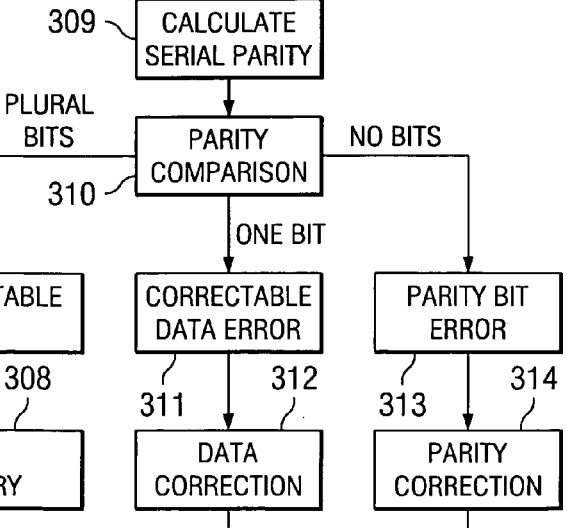
FIG. 2
FIG. 3

SOFT ERROR DETECTION AND CORRECTION BY 2-DIMENSIONAL PARITY

CLAIM OF PRIORITY

This application claims priority under 35 U.S.C. 1.119(a) from U.K. Patent Application No. 0322597.6 filed Sep. 26, 2003.

TECHNICAL FIELD OF THE INVENTION

The technical field of this invention is memory error correction.

BACKGROUND OF THE INVENTION

Due to the decreasing size of memory elements their susceptibility to value corruption due to radiation induced effects from cosmic radiation is becoming a noticeable problem in some critical applications. Even within these applications, some memory uses are more vulnerable than others. Errors to the operating program can be very serious as they can lead to indefinite malfunctioning of the equipment. Such errors often require the device to be reset. Other errors in the data memory are considerably less dangerous for some applications because there is often some ambiguity as to the data anyway. In these cases the soft-error only causes a marginal increase in this ambiguity. This may be undetectable. This invention is a method for protecting the critical program memory for these types of applications. This invention also gives some limited protection to other memory uses like constant data.

Traditionally memories are protected by generating a number of parallel bits based on Hamming codes on a one-dimensional array of data bits often referred to as a memory line. This invention is a method of reducing the overhead of protecting memory from the rare radiation induced memory events. This invention employs just one bit of traditional parallel generated parity per memory line and a second serially generated parity bit per location in the memory line.

SUMMARY OF THE INVENTION

Two arrays of parities surround the memory. One array is generated in parallel. The other array is generated in serial. This increases the memory size by 0.5%. The two dimensional parity is used to protect, locate and correct the errors automatically. The incidence of digital signal processors crashing in remote locations due to radiation induced soft errors is reduced by about 99% using this technique.

This invention uses less extra logic than conventional techniques for relatively high speed correction. This extra logic requires approximately 0.5% overhead. This invention uses smaller and cheaper circuits than conventional techniques.

BRIEF DESCRIPTION OF THE DRAWINGS

These and other aspects of this invention are illustrated in the drawings, in which:

FIG. 2 is a flow chart illustrating preparation for using this invention; and

FIG. 3 is a flow chart illustrating the steps of use of this invention.

DETAILED DESCRIPTION OF PREFERRED EMBODIMENTS

Figure 1:
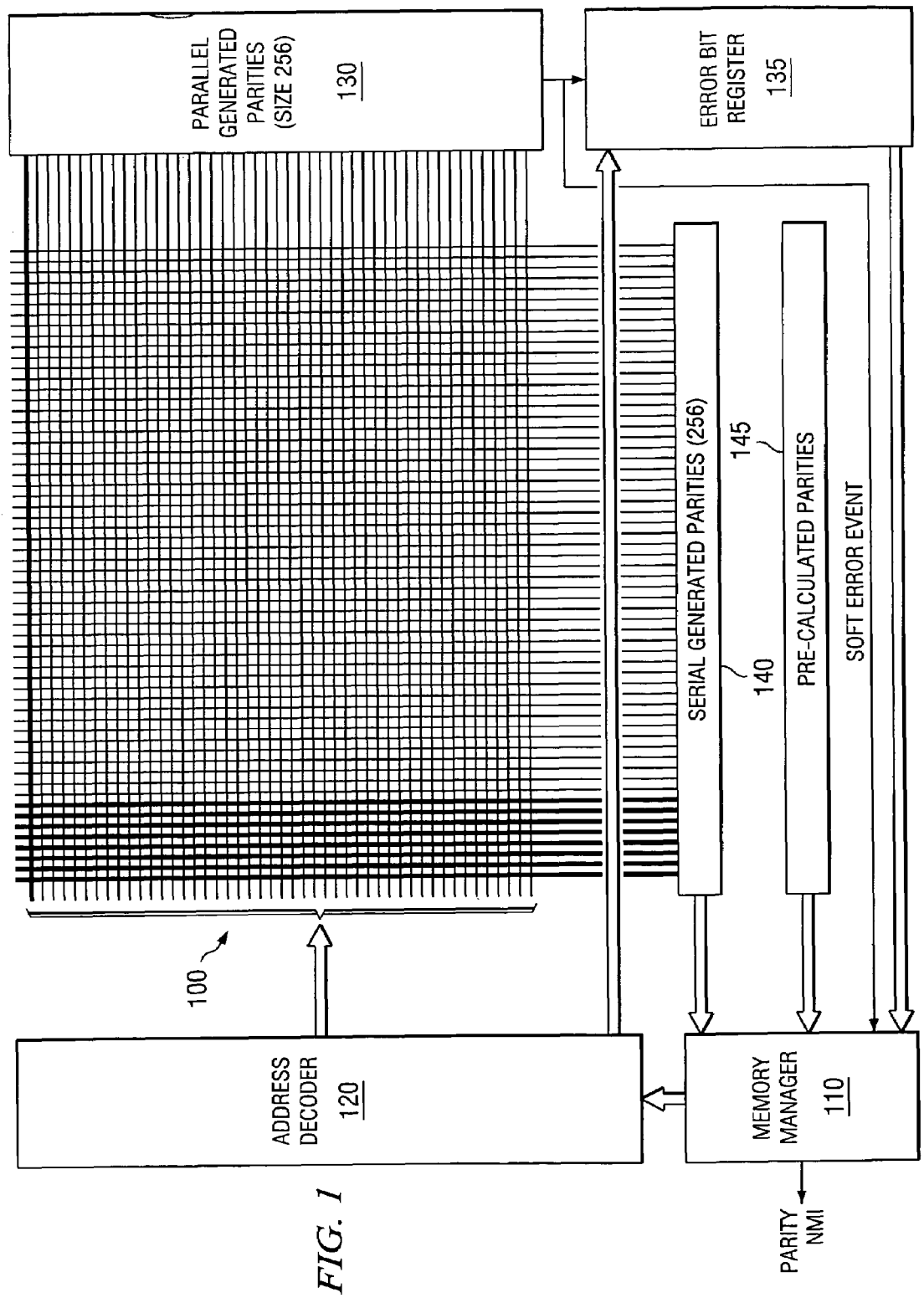
FIG. 1 illustrates a memory array and the two dimensional parity circuits of a preferred embodiment of this invention.

FIG. 1 illustrates a memory employing this invention. Memory 100 as a 2-dimensional array of bits arranged in rows and columns. Read and write accesses to memory 100 are controlled by memory manager 110. Address decoder 120 receives the accessed address from memory manager 110 and selects a corresponding row of memory 100 for access. This row access also access parity data stored in parallel generated parities 130. On read accesses parallel generated parities 130 generates a new parity from the just accessed data line. Parallel generated parities 130 compares this newly calculated parity with the corresponding stored parity. Parallel generated parities 130 transmits an active soft error (SER) signal to memory manager 110 if these do not match.

When this SER signal is detected, memory manager 110 produces a non maskable interrupt (NMI) or other high priority event to the data processor. Error bit register 135 stores a reduced address of the memory line upon receipt of the soft error signal form parallel generated parities 103. For example, for a 256-bit memory line, all bits except the 5 least significant bits are written to this register. Memory manager 110 responds to the SER signal differently depending on the address accessed. Serial generated parities 140 generates a parity for individual columns of memory 100 if the accessed address is within a range of addresses having pre-calculated parties stored in pre-calculated parities 145. Limitation to a subset range of addresses limits the amount of serial parity data that must be stored in pre-calculated parities 145.

FIG. 2 illustrates process 200 for generating the parity stored in pre-calculated parities 145. Process 200 begins at start block 201. Process 200 receives an indication of the address range (processing block 202). This indication could be: a start address and an end address; a start address and a range length; or other means to designate a range of addresses. This range of addresses need not be contiguous. Process 200 then calculates the parity for each column for the rows within the range of addresses (processing block 203). Process 200 then stores these parities (processing block 204). Process 200 then completes (end block 205).

In the preferred embodiment the range of addresses selected corresponds to critical stored information. As an example, this range of addresses could be selected to include the data processor program instructions or at least a critical subset of these instructions. Alternatively, the range of addresses may be selected to include critical data such as constants used in the program.

Parallel generated parities 130 produces parallel horizontal parities across the 256-bit word width of the memory. Parallel generated parities 130 produces a parity error when at least one bit of the memory line is corrupted by radiation. Serial generated parities 140 provides a separate vertical parity, because these bits go vertically through the memory. Thus each bit in the memory is effectively protected by 2 parity bits, the parallel horizontal bit and the serial vertical bit.

FIG. 3 illustrates process 300 for memory reads including the horizontal and vertical parity of this invention. Process 300 begins at start block 301. Process 300 recalls the addressed data and the corresponding parity (processing block 302) Process 300 calculates the parity of the just recalled data (processing block 303).

Process 300 checks to determine if the recalled parity matches the newly calculated parity (decision block 304). If they match (Yes at decision block 304), the data is assumed to be correct. Process 300 continues at block 305. This would involve the use of the just recalled data by the data processor.

If they do not match (No at decision block 304), then process 300 checks to determine if the accessed data is within the address range covered by the serial parity (decision block 306). As previously described, the pre-calculated parities 145 cover only a subset of the address range of memory 100. If the accessed address is outside the address range (No at decision block 306), then this error cannot be corrected by this invention (processing block 307). Process 300 enters an error recovery routine (processing block 308). The exact nature of this error recovery routine is beyond the scope of this invention. However, this could involve reloading the accessed data from another memory, reloading the accessed data from a non-volatile memory such as a magnetic or optical disk and restarting the current program running on the data processor. Process 300 continues at block 305 following error recovery.

If the accessed data was within the address range (Yes at decision block 306), then process 300 calculates the parity along the other dimension for each bit within the address range (processing block 309). This calculation takes place in serial generated parities 140. Process 300 next compares these newly generated parities against pre-calculated parties 145 (decision block 310). There are three types of comparison outcomes. It is possible that plural parity bits do not match (Plural Bits at decision block 310). This indicates that plural bits of the originally accessed data have changed. Process 300 judges this an uncorrectable error (processing block 307). This error cannot be corrected by this invention (processing block 307). Process 300 enters an error recovery routine (processing block 308) and continues at block 305 following error recovery.

The second possible result of the parity comparison is one bit does not match (One Bit at decision block 310). This indicates an error in a single bit which can be corrected by this invention (processing block 311). The vertical/serial parity showing the non-match identifies the column of the memory error. The original access address identifies the row of the memory error. Thus process 300 identifies and corrects this data error (processing block 312). Process 300 continues at block 305 following this data correction.

The third possible result of the parity comparison is that no bits fail to match (No Bits at decision block 310). This indicates that there are no data errors in the vertical parity data. This would generally occur only if the soft error was in the horizontal parity bit itself (processing block 313). Thus the original data was correct but an error in the parity bit caused the parity mismatch (No at decision block 304). Process 300 corrects this at processing block 314. This correction could be recalculation of the parity of the horizontal memory line or simple inversion of the parity bit. Process 300 continues at block 305 following this parity correction.

What is claimed is:

1. A memory system comprising:
    a memory array including a plurality of memory bits disposed in a plurality of rows and a plurality of columns;
    a first parity memory having a stored first parity bit associated with each row of said memory array;
    an address decoder connected to said memory array and said first parity memory receiving an address to be accessed and selecting one row of said memory array and a stored first parity bit corresponding to said address to be accessed;
    a first parity generator connected to said memory array for generating a new first parity bit corresponding to data stored in said row of said memory array selected by said address to be accessed,
        comparing said new first parity bit with said selected stored first parity bit, and
        generating a soft error signal if said new first parity bit fails to match said selected stored first parity bit;
    a second parity memory having a stored second parity bit corresponding to each column of said memory array associated with a predetermined subset of less than all rows of said memory array;
    a second parity generator connected to said memory array for generating when triggered a new second parity bit corresponding to data stored in each column of said memory array of said predetermined subset of rows;
    a memory manager connected to said first parity generator, said second parity memory and said second parity generator, said memory manager for
        triggering said second parity generator upon receipt of a soft error signal from said first parity generator and said address to be accessed is within said predetermined subset of rows,
        comparing said new second parity bits with said stored second parity bits following triggering said second parity generator,
        generating an interrupt signal to a data processor connected to said memory system upon receipt of said soft error signal from said first parity generator if said address to be accessed is not within said predetermined subset of rows or if said address to be accessed is within said predetermined subset of rows and a plurality of said new second parity bits fail to match corresponding stored second parity bits.

2. The memory system of claim 1, wherein:
    said interrupt generated by said memory manager is a non-maskable interrupt.

3. The memory system of claim 1, wherein:
    said memory manager corrects the state of a memory bit stored at said row selected by said address to be accessed and said column generating a mismatch between said new second parity bit and said stored second parity bit when a single new second parity bits fails to match said corresponding stored second parity bit.

4. The memory system of claim 1, wherein: said memory manager corrects the state of a stored first parity bit corresponding to said row selected by said address to be accessed when no new second parity bits fails to match said corresponding stored second parity bit.

5. The memory system of claim 1, further comprising:
    an error bit register connected to said address decoder, said first parity generator and said memory manager, said error bit register storing said address to be accessed from said address decoder upon receipt of a soft error signal from said first parity generator and supplying said stored address to said memory manager.

6. A method of operating a memory system comprising the steps of:
    storing a stored first parity bit associated with each row of a memory array having a plurality of rows and a plurality of columns;

upon a read access to the memory array selecting one row of said memory array and a stored first parity bit corresponding to an address to be accessed;

generating a new first parity bit corresponding to data stored in the row of the memory array selected by the address to be accessed;

comparing the new first parity bit with the selected stored first parity bit;

generating a soft error signal if the new first parity bit fails to match the selected stored first parity bit;

storing a second parity bit corresponding to each column of memory array associated with a predetermined subset of less than all rows of the memory array;

generating a new second parity bit corresponding to data stored in each column of the memory array of the predetermined subset of rows upon generation of the soft error signal;

comparing new second parity bits with stored second parity bits upon generation of the soft error signal;

generating an interrupt signal to a data processor connected to the memory system upon generation of the soft error signal if the address to be accessed is not within the predetermined subset of rows; and generating an interrupt signal to the data processor if the address to be accessed is within said predetermined subset of rows and a plurality of the new second parity bits fail to match corresponding stored second parity bits.

7. The method of claim 6, further comprising the step of:

correcting the state of a memory bit stored at the row selected by the address to be accessed and the column generating a mismatch between the new second parity bit and the stored second parity bit when a single new second parity bits fails to match the corresponding stored second parity bit.

8. The method of claim 6, further comprising the step of:

correcting the state of a stored first parity bit corresponding to the row selected by the address to be accessed when no new second parity bits fails to match the corresponding stored second parity bit.

9. The method of claim 6, further comprising the step of:

storing the address to be accessed upon generation of a soft error signal.

10. The method of claim 6, further comprising the steps of:

setting the address range thereby specifying the predetermined subset of less than all rows of the memory array;

calculating a second parity bit corresponding to each column of memory array within the address range upon a second parity calculation mode.

11. The method of claim 10, wherein:

said step of setting the address range sets an address start and an address end.

12. The method of claim 10, wherein:

said step of setting the address range set an address start and a length.

13. The method of claim 6, further comprising the step of:

calculating the first parity bit upon each write to row of the memory array.

* * * * *